United States Patent
Hu et al.

(10) Patent No.: US 7,847,648 B2
(45) Date of Patent: Dec. 7, 2010

(54) OSCILLATOR WITH DELAY COMPENSATION

(75) Inventors: Yaqi Hu, Plano, TX (US); Yanli Fan, Plano, TX (US); Mark W. Morgan, Allen, TX (US); Huawen Jin, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 84 days.

(21) Appl. No.: 12/250,340

(22) Filed: Oct. 13, 2008

(65) Prior Publication Data

US 2010/0090772 A1 Apr. 15, 2010

(51) Int. Cl.
*H03K 3/02* (2006.01)
(52) U.S. Cl. .................. 331/143; 331/153
(58) Field of Classification Search ............. 331/111, 331/143, 153
See application file for complete search history.

(56) References Cited

U.S. PATENT DOCUMENTS

| | | | | |
|---|---|---|---|---|
| 5,670,915 A * | 9/1997 | Cooper et al. | .......... | 331/111 |
| 5,859,571 A * | 1/1999 | Lee et al. | .......... | 331/53 |
| 6,020,792 A | 2/2000 | Nolan et al. | | |
| 6,201,450 B1 | 3/2001 | Shakiba et al. | | |
| 6,225,872 B1 * | 5/2001 | Verhoeven | .......... | 331/143 |
| 6,337,605 B1 | 1/2002 | Divoux | | |
| 6,456,170 B1 * | 9/2002 | Segawa et al. | .......... | 331/143 |
| 6,924,709 B2 | 8/2005 | Bashar | | |
| 7,138,880 B2 | 11/2006 | Ma et al. | | |
| 7,375,599 B2 * | 5/2008 | Molina | .......... | 331/143 |
| 7,577,002 B2 * | 8/2009 | Yang | .......... | 363/1 |
| 2008/0279324 A1 * | 11/2008 | Lin et al. | .......... | 375/376 |

* cited by examiner

*Primary Examiner*—Robert Pascal
*Assistant Examiner*—Levi Gannon
(74) *Attorney, Agent, or Firm*—John J. Patti; Wade J. Brady, III; Frederick J. Telecky, Jr.

(57) ABSTRACT

In the many microelectronics applications, delays present in circuitry can affect both the design and the function of the circuitry. One example of delays impacting the function of a circuit is a relaxation oscillator, where delays present in comparator circuits and latches can cause its frequency to vary beyond desired ranges. Here, a relaxation circuit with delay compensation is described.

20 Claims, 3 Drawing Sheets

OSCILLATOR WITH DELAY COMPENSATION

TECHNICAL FIELD

The invention relates generally to oscillators and, more particularly, to relaxation oscillators having delay compensation.

BACKGROUND

Relaxation oscillators have become increasingly common in microelectronics. Some examples of conventional designs can be found in U.S. Pat. Nos. 6,020,792; 6,201,450; 6,337,605; 6,456,170; 6,924,709; and 7,138,880. These oscillators oftentimes use a signal that has a generally triangular waveform that is input into a pair of comparators. FIG. 1 depicts an ideal triangular waveform, where the signal is confined between two reference voltages.

However, as speeds increase and as real-world effects become apparent, the signals can stray away from their idealized forms. Some of the real-world effects that can affect the operations of relaxation oscillators are delays present in some of the components, such as latches and comparators. FIG. 2 depicts a voltage versus time graph depicting a triangular waveform for a relaxation oscillator with delays. As can be seen in FIG. 2, the triangular wave overshoots the upper voltage (V1) by a small amount ($\delta_1$) and undershoots the lower voltage (V2) by a small amount ($\delta_2$), each of which can be attributed to delays present in the circuit. Additionally, these voltage differences ($\delta_1$ and $\delta_2$) are not necessarily static, but in fact, can vary depending on a number of factors, including temperature, which can cause the frequency and period of the triangular waveform to vary.

Therefore, there is a need for a method and/or apparatus to compensate for circuit delays.

SUMMARY

A preferred embodiment of the present invention, accordingly, provides an apparatus. The apparatus comprises a charge pump having a switching node and an output node, wherein the charge pump receives an output signal on the switching node; a plurality of compensators; a comparator circuit that is coupled to the output node of the charge pump and coupled to each integrator, wherein the comparator circuit receives a threshold voltage from each integrator; and a latch that receives a plurality of input signals from the comparator circuit and that generates the output signal. Each compensator includes a switching network that is coupled to the output node, wherein the switching network receiving at least one of a plurality of input voltages, and wherein the switching network has a first capacitor; and an integrator that is coupled to the first capacitor, wherein the integrator receives at least one of the plurality of input voltages.

In accordance with another preferred embodiment of the present invention, the plurality of compensators further comprises a first compensator and a second compensator.

In accordance with another preferred embodiment of the present invention, the switching network of the first compensator receives a first input voltage of the plurality of input voltages and the switching circuit of the second compensator receives a second input voltage of the plurality of input voltages.

In accordance with another preferred embodiment of the present invention, the integrator of the first compensator receives the second input voltage and the integrator of the second compensator receives the first voltage.

In accordance with another preferred embodiment of the present invention, the comparator circuit further comprises a first and a second comparator, each comparator having a positive and a negative input node.

In accordance with another preferred embodiment of the present invention, the output node of the charge pump is coupled to the negative input node of the first comparator and the positive input node of the second comparator.

In accordance with another preferred embodiment of the present invention, a method for adjusting a first threshold voltage in a relaxation oscillator by using a compensator. The method comprises charging a first capacitor in the compensator to a first voltage; discontinuing the charging of the first capacitor at an edge of an output signal from a latch; generating a first set of non-overlapping pulses from a switching circuit in the compensator following the edge; discharging the first capacitor through a second capacitor for the duration of a first pulses from the first set of non-overlapping pulses so as to generate a second voltage that is an adjustment of the first threshold voltage by a voltage difference; and applying the second voltage to a comparator circuit as a second threshold voltage.

In accordance with another preferred embodiment of the present invention, the method further comprises precharging the first capacitor for the duration of a second pulse from the second set of non-overlapping pulses.

In accordance with another preferred embodiment of the present invention, the edge is a rising edge.

In accordance with another preferred embodiment of the present invention, the edge is a falling edge.

In accordance with another preferred embodiment of the present invention, the method further comprises a step of comparing the first threshold voltage with the signal having the generally triangular waveform.

In accordance with another preferred embodiment of the present invention, an apparatus for adjusting a first threshold voltage in a relaxation oscillator by using a compensator is provided. The apparatus comprises means for charging a first capacitor in the compensator to a first voltage; means for discontinuing the charging of the first capacitor at an edge of an output signal from a latch; means for generating a first set of non-overlapping pulses from a switching circuit in the compensator following the edge; means for discharging the first capacitor through a second capacitor for the duration of a first pulses from the first set of non-overlapping pulses so as to generate a second voltage that is an adjustment of the first threshold voltage by a voltage difference; and means for applying the second voltage to a comparator circuit as a second threshold voltage.

In accordance with a preferred embodiment of the present invention, the apparatus further comprises means for precharging the first capacitor for the duration of a second pulse from the second set of non-overlapping pulses.

In accordance with another preferred embodiment of the present invention, the apparatus further comprises means for comparing the first threshold voltage with the signal having the generally triangular waveform.

In accordance with another preferred embodiment of the present invention, an apparatus is provided. The apparatus comprises a switching circuit that receives a generally square wave signal and outputs a plurality of non-overlapping pulses; an integrator that outputs a first threshold voltage; a first capacitor; a first switch responsive to the generally square wave signal, wherein the first switch inputs a generally triangular signal into the first capacitor when closed; and a switch network that is coupled to the first capacitor and that is responsive to the plurality of non-overlapping pulses, wherein the switch network precharges the first capacitor for the duration of at least one of the non-overlapping pulses, and wherein the switch network couples the first capacitor to the integrator for the duration of at least one of the non-overlapping pulses.

In accordance with another preferred embodiment of the present invention, the integrator further comprising an amplifier having a plurality of input nodes and an output node; and a second capacitor forming a feedback loop between the output node and at least one of the input nodes of the amplifier, wherein the second capacitor is coupled to the switching network so that the first capacitor is coupled to the second capacitor of the integrator for the duration of at least one of the non-overlapping pulses.

In accordance with another preferred embodiment of the present invention, the generally triangular signal is output through an output node of a charge pump.

In accordance with another preferred embodiment of the present invention, the apparatus further comprises a comparator circuit that receives the first threshold voltage and the generally triangular signal.

In accordance with another preferred embodiment of the present invention, the apparatus further comprises a latch that is coupled to the comparator circuit and that outputs the generally square wave signal.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
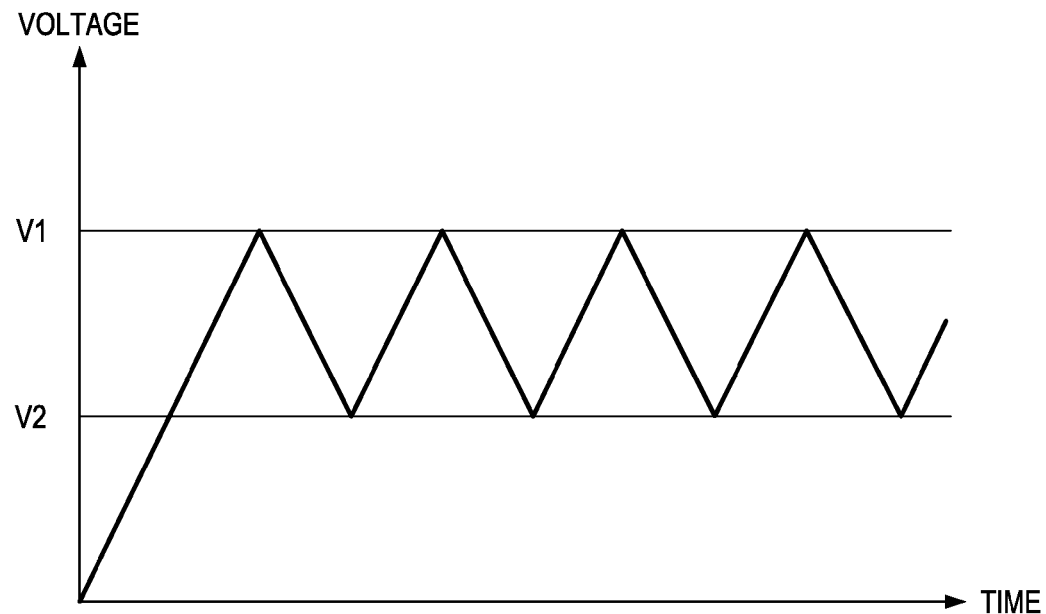
FIG. 1 is a voltage versus time graph depicting an ideal triangular waveform for a relaxation oscillator.
Figure 2:
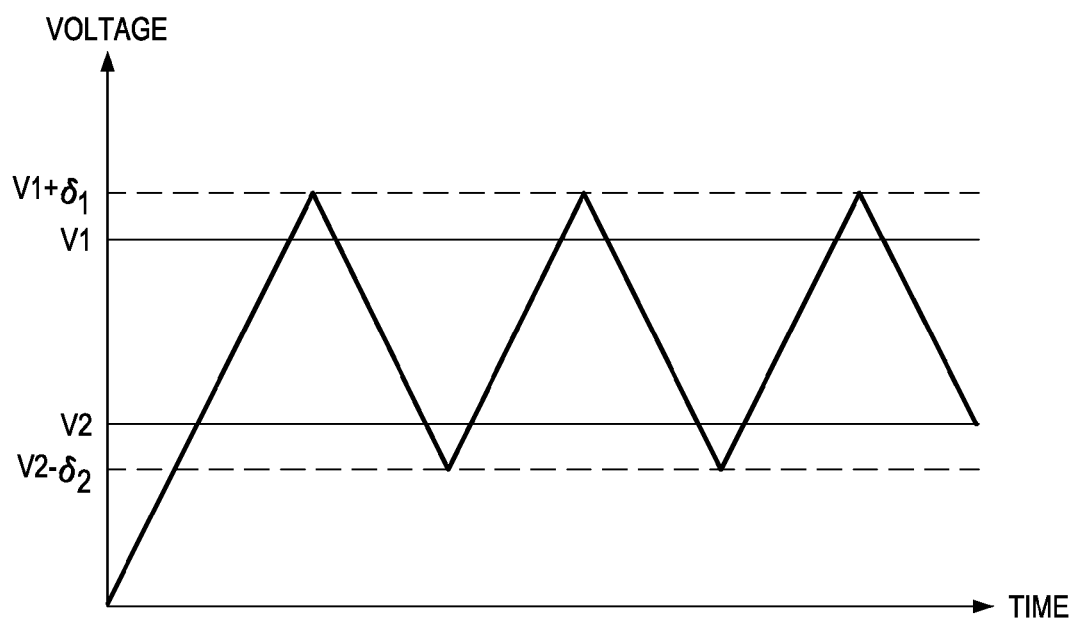
FIG. 2 is a voltage versus time graph depicting a triangular waveform for a relaxation oscillator with delays.

Refer now to the drawings wherein depicted elements are, for the sake of clarity, not necessarily shown to scale and wherein like or similar elements are designated by the same reference numeral through the several views.

Figure 3:
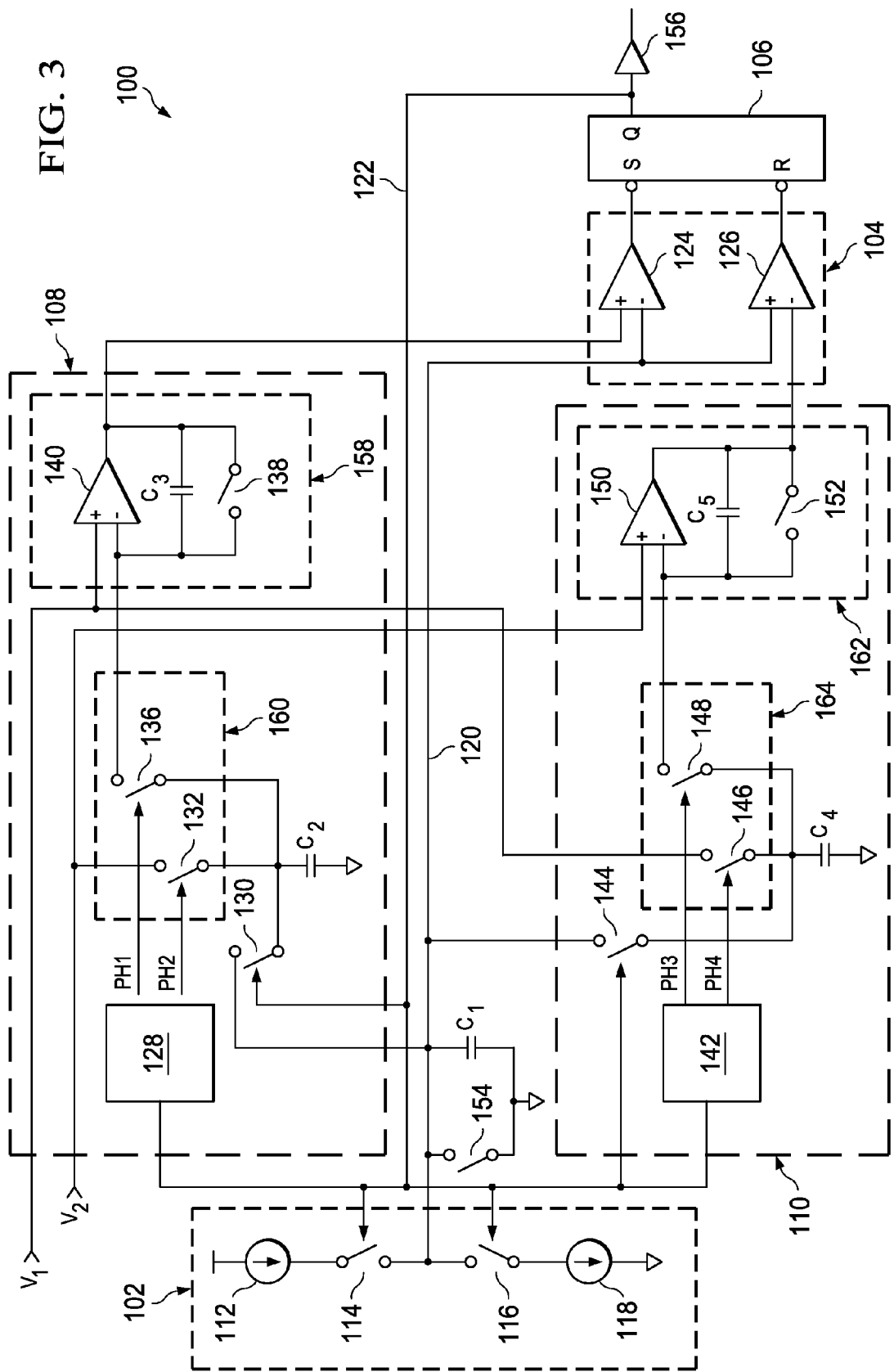
FIG. 3 is a relaxation oscillator having delay compensation in accordance with a preferred embodiment of the present invention.

Referring to FIG. 3 of the drawings, the reference numeral 100 generally designates a relaxation oscillator having delay compensation in accordance with a preferred embodiment of the present invention. For example, the oscillator 100 can operate at a frequency of about 54 MHz; however, the operational frequency can vary from a few megahertz to over 100 MHz. The oscillator 100 generally comprises several major components: a charge pump 102; compensators 108 and 110; a comparator circuit 104; and a latch 106.

The charge pump 102 generally operates to provide charge to capacitors in the oscillator 100 and to assist in generating a signal having a generally triangular waveform. Charge pump 102 is generally comprised of current sources 112 and 118 coupled in series with a pair of switches 114 and 116, where the switches 114 and 116 are interposed between the current sources 112 and 118. Each of the switches 114 and 116 is coupled to the output of the latch 106 on switching node 122 and are controlled or opened/closed by the signal from the latch 106 (which is a generally square wave signal). Preferably, switch 114 is closed when the output signal of the latch 106 is logic low (allowing charge to flow from the current source 112 to output node 120), and switch 116 is closed when the output signal of the latch 106 is logic high (allowing charge to flow from the output node 120 to current source 118). Additionally, switches 114 and 116 can be transmission gates.

Coupled to output node 120 are a capacitor $C_1$ and switch 154, which are in parallel with one another. As charge flows to and from the output node 120, capacitor $C_1$ is charged and discharged to assist in generating the generally triangular waveform. For example, this capacitor $C_1$ can be about 700 fF. Switch 154 can also be a transmission gate.

Also, coupled to the output node 120 is a comparator circuit 104. The comparator circuit is generally comprised of comparators 124 and 126. These comparators 124 and 126 preferably operate to compare the generally triangular signal present on the output node 120 with reference voltages. Preferably, the negative input node of comparator 124 is coupled to the output node 120 while the positive input node of comparator 124 receives a reference voltage from compensator 108 to generally provide an upper or high-going signal. Additionally, the positive input node of comparator 126 is preferably coupled to the output node 120 while the negative input node of comparator 126 receives a reference voltage from compensator 110 to generally provide a lower or low-going signal.

Based on the outputs of the comparator circuit 104, the latch 106 generates a generally square wave output signal on the switching node 122. Preferably, latch 106 is of an RS-type. The upper input of the latch 106 receives the upper signal from comparator 124, which would correspond to the generally triangular signal on the output node 120 reaching or eclipsing the reference signal input into comparator 124. The lower input of the latch 106 receives the lower signal from comparator 126, which would correspond to the generally triangular signal on the output node 120 from reaching or eclipsing the lower reference voltage input into comparator 126.

Each of the comparator circuit 104 and the latch 106 has propagation delays present in the circuitry that would allow the generally triangular signal present on the output node 120 to overshoot or undershoot desired input voltages V1 and V2. To combat the delays of the comparator circuit 104 and the latch 106, compensators 108 and 100 are employed. Preferably, first compensator 108 generates a first corrected threshold voltage (that compensates for delays) for comparator 124 and latch 106 while second compensator 110 generates a second corrected threshold voltage (that compensates for delays) for comparator 126 and latch 106. Within each of the compensators 108 and 110, there are a number of subcomponents. Each compensator 108 and 110 generally comprises (respectively) a switching circuit or pulse generator 128 and 142, a switch network 160 and 164, and an integrator 158 and 162.

Figure 4:
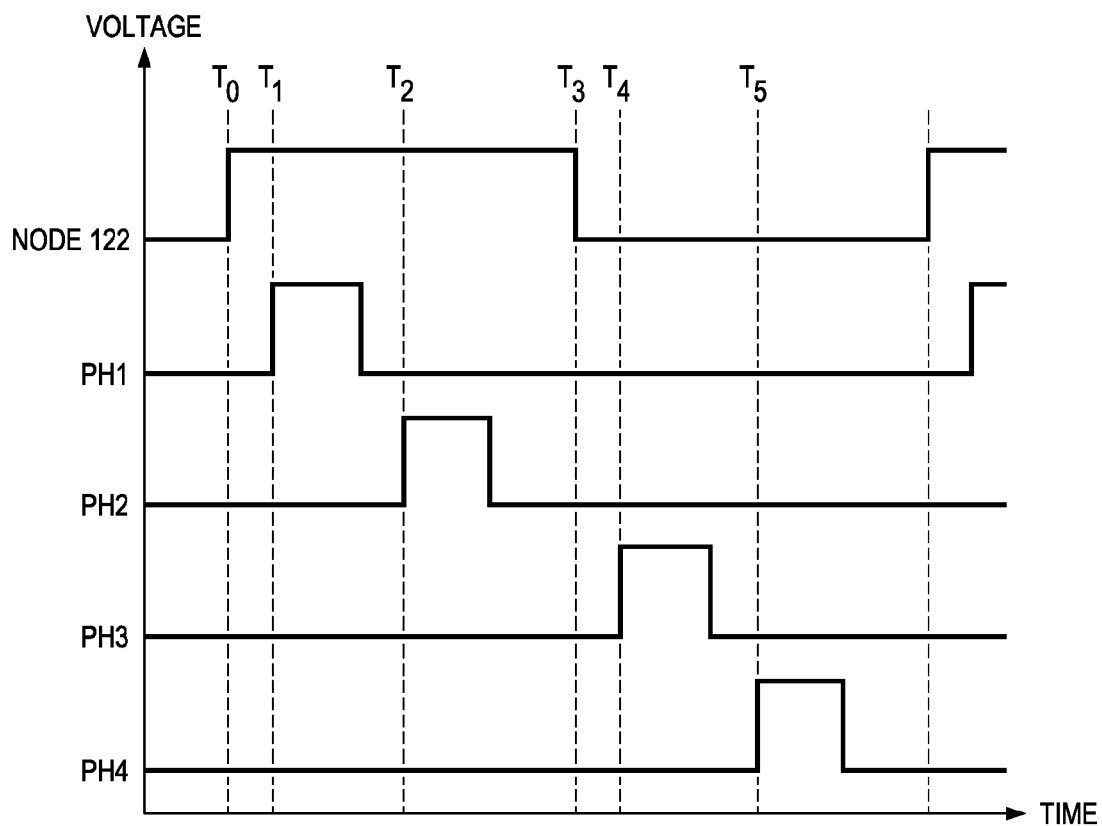
FIG. 4 is a timing diagram for the switching circuits of FIG. 3.

Looking first to the switching circuits 128 and 142, each of the switching circuits 128 and 142 is coupled to the switching node 122 and generally includes delay elements and logic gates to generate switching signals on nodes PH1, PH2, PH3, and PH4. As can be seen in FIG. 4, non-overlapping pulses for each of the nodes PH1, PH2, PH3, and PH4 is generated. These non-overlapping pulses are typically generated in response to or after a rising or falling edge of the generally square wave output signal present on switching node 122. As shown, switching circuit 128 generates two non-overlapping pulses, one for each nodes PH1 and PH2, following a rising edge of the output signal present on switching node 122, while switching circuit 142 generates two non-overlapping pulses, one for each node PH3 and PH4, following a falling edge of the output signal present on switching node 122.

Within each of the compensators 108 and 110, there are other separate components. Preferably, each of the compensators 108 and 110, respectively, includes a switch 130 and 144 and capacitor $C_2$ and $C_4$. Each of switches 130 and 144 is generally controlled by the output signal present on the switching node 122 in opposing phases, and switches 130 and 144 can be transmissions gates. As depicted, switch 130 can be closed when the generally square wave signal present on the switching node 122 is logic low, and switch 144 can be closed when the generally square wave signal present on the switching node 122 is logic high. When one of the switches 130 and 144 is closed, the respective capacitor $C_2$ and $C_4$ can be coupled in parallel to capacitor $C_1$, which allows the charging through one of the current sources 112 and 118, as appropriate.

Generally, to begin operations, the oscillator 100 is reset (which can also be reset as desired). When a reset is asserted, switches 154, 138, and 152 are closed, which causes each capacitor $C_1$, $C_3$, and $C_5$ to be shorted. Because capacitor $C_1$, $C_3$, and $C_5$ are shorted, the threshold voltages of comparators 124 and 126 are equal to input voltages V1 and V2, respectively.

Figure 5:
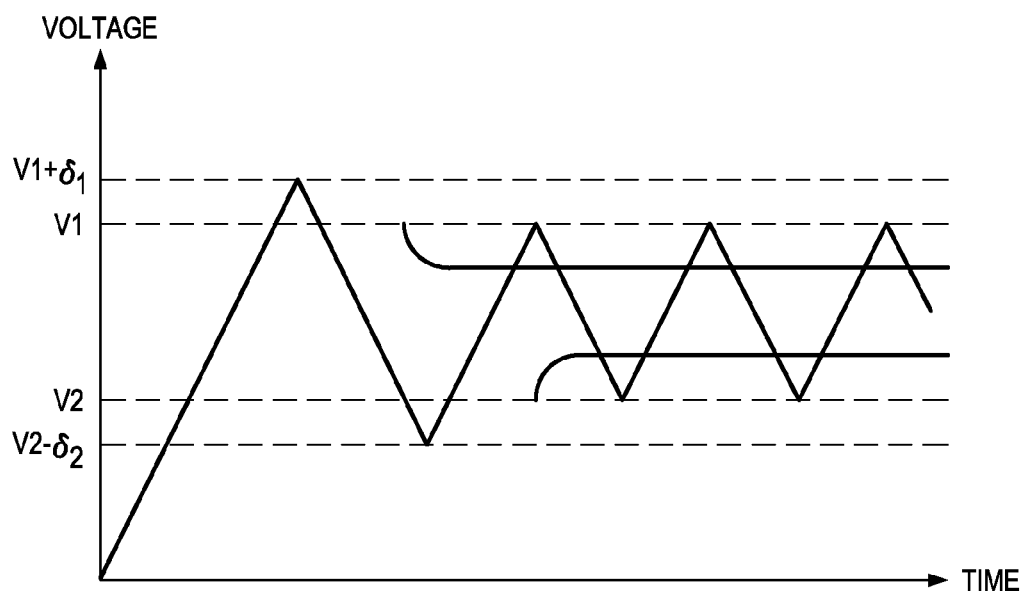
FIG. 5 is a voltage versus time graph depicting the generally triangular waveform for the relaxation oscillator of FIG. 3.

Turning to FIG. 5 of the drawings, the voltages at output node 120 during the charging of capacitors $C_2$ and $C_4$ is generally shown. Initially, after a reset, the voltage at node 120 overshoots input voltage V1 by $\delta_1$ and undershoots input voltage V2 and by $\delta_2$. Afterward, when capacitor $C_2$ is being charged by current source 112, the voltage at output node 120 rises until the signal at switching node 122 becomes logic high, which causes switch 130 to shut off. At the time that switch 130 becomes off, the peak upper voltage of V1+$\delta_1$ can be stored at capacitor $C_2$. Similarly, capacitor $C_4$ can be charged to V2−$\delta_2$ during the period where the signal at switching node 122 is logic high.

Now turning back to FIG. 3, each of the switching networks 160 and 164 and integrators 158 and 160 includes several other components. Each switching network 160 and 164 generally comprises (respectively) a pair of switches 132/136 and 146/148. Each integrator 158 and 162 generally comprises (respectively) an amplifier 140 and 150, a capacitor $C_3$ and $C_5$, and a switch 138 and 152. Additionally, switches 132, 136, 146, 148, 138, and 152 can be transmission gates.

With respect to compensator 108, switching circuit 128 preferably generates a pair of non-overlapping pulses after the signal at switching node 122 becomes logic high. The first non-overlapping pulse occurs at switching signal node PH1, which gates switch 136. During the period when the pulse on node PH1 is logic high, switch 136 is closed. Because the voltage across capacitor $C_2$ is initially higher than the voltage across capacitor $C_3$, amplifier 140 discharges capacitor $C_2$ through capacitor $C_3$ until the voltage across capacitor $C_2$ is generally equal to input voltage V1, which results in a transfer of charge of $C_2 * \delta_1$ and results in the voltage across capacitor $C_3$ being changed by $(C_2 * \delta_1)/C_3$. Once switching signal node PH1 becomes logic low, the output voltage of amplifier 140 or threshold voltage of comparator 124 can be held at V1−$(C_2 * \delta_1)/C_3$ by capacitor $C_3$.

Following the first non-overlapping pulse on switching signal node PH1, a second non-overlapping pulse (of the pair) is generated by switching circuit 128 on signal switching node PH2. When switching signal node PH2 becomes logic high, switch 132 is closed so that capacitor $C_2$ can be precharged to input voltage V2. Precharging of capacitor $C_2$ generally prevents a sudden change in voltage across capacitor $C_1$ when switch 130 is closed at the beginning of the next cycle.

With respect to compensator 110, switching circuit 142 preferably generates a pair of non-overlapping pulses after the signal at switching node 122 becomes logic low. The first non-overlapping pulse occurs at switching signal node PH3, which closes switch 148. During the period when the pulse on node PH3 is logic high, switch 148 is closed. Because the voltage across $C_4$ is initially lower than the input voltage V2, amplifier 150 discharges capacitor $C_4$ through capacitor $C_5$ until the voltage across capacitor $C_4$ is generally equal to input voltage V2, which results in a transfer of charge of $C_4 * \delta_2$ and results in the voltage across capacitor $C_5$ being changed by $(C_4 * \delta_2)/C_5$. Once switching signal node PH3 becomes logic low, the output voltage of amplifier 150 or threshold voltage of comparator 126 can be held at V2+$(C_4 * \delta_2)/C_5$ by capacitor $C_5$.

Following the first non-overlapping pulse on switching signal node PH3, a second non-overlapping pulse (of the pair) is generated by switching circuit 142 on signal switching node PH4. When switching signal node PH4 becomes logic high, switch 146 is closed so that capacitor $C_4$ can be precharged to input voltage V1. Precharging of capacitor $C_4$ generally prevents a sudden change in voltage across capacitor $C_1$ when switch 130 is closed at the beginning of the next half-cycle.

Now turning back to FIG. 5, it also shows correction occurring after one cycle. Although it is possible to have correction after a single cycle, it is likely that that capture would occur after several cycles (two or more). With correction, the threshold voltage for comparator 124 is generally about V1−$\delta_1$, and the threshold voltage for comparator 126 is generally about V2+$\delta_2$. Because the threshold voltages for comparators 124 and 126 are generally offset by amounts $\delta_1$ and $\delta_2$, the comparators 124 and 126 will trigger the latch 106 at an earlier time; therefore, the delays in latch 106 and comparator circuit 104 can be compensated for to generate an output clock signal (on output node 122) having a generally predictable period.

Another aspect of the circuit is the selection of the values for the capacitors $C_2$ through $C_5$. Generally, there is a limitation on the sizes of the capacitors that can be used. The capacitors $C_2$ through $C_5$ should be small enough so as to not interfere with the operation of the capacitor $C_1$, charge pump 120, comparator circuit 106, and latch 106; however, the capacitors $C_2$ through $C_5$ should be large enough so as to not be overshadowed by parasitic capacitances of switches 130, 132, 136, 144, 146, and 148. For example, the capacitors $C_2$ through $C_5$ can be on the order of 10 fF, but the values can vary depending on several factors, including parasitic capacitances present in the circuitry and operational frequency of the oscillator 100.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus, comprising:
a charge pump having a switching node and an output node, wherein the charge pump receives an output signal on the switching node;
a plurality of compensators, each compensator including:
a switching network that is coupled to the output node, wherein the switching network receives at least one of a plurality of input voltages, and wherein the switching network has a first capacitor; and
an integrator that is coupled to the first capacitor, wherein the integrator receives at least one of the plurality of input voltages;
a comparator circuit that is coupled to the output node of the charge pump and coupled to each integrator, wherein the comparator circuit receives a threshold voltage from each integrator; and
a latch that receives a plurality of input signals from the comparator circuit and that generates the output signal.

2. The apparatus of claim 1, wherein the plurality of compensators further comprises a first compensator and a second compensator.

3. The apparatus of claim 2, wherein the switching network of the first compensator receives a first input voltage of the plurality of input voltages and the switching network of the second compensator receives a second input voltage of the plurality of input voltages.

4. The apparatus of claim 3, wherein the integrator of the first compensator receives the second input voltage and the integrator of the second compensator receives the first voltage.

5. The apparatus of claim 1, wherein the comparator circuit further comprises a first and a second comparator, each comparator having a positive and a negative input node.

6. The apparatus of claim 5, wherein the output node of the charge pump is coupled to the negative input node of the first comparator and the positive input node of the second comparator.

7. A method for adjusting a first threshold voltage in a relaxation oscillator by using a compensator, the method comprising:
charging a first capacitor in the compensator to a first voltage;
discontinuing the charging of the first capacitor at an edge of an output signal from a latch;
generating a first set of non-overlapping pulses from a switching circuit in the compensator following the edge;
discharging the first capacitor through a second capacitor for the duration of a first pulse from the first set of non-overlapping pulses so as to generate a second voltage that is an adjustment of the first threshold voltage by a voltage difference;
applying the second voltage to a comparator circuit as a second threshold voltage; and
precharging the first capacitor for the duration of a second pulse from a second set of non-overlapping pulses.

8. The method of claim 7, wherein the edge is a rising edge.

9. The method of claim 7, wherein the edge is a falling edge.

10. The method of claim 7, wherein the method further comprises a step of comparing the first threshold voltage with a signal having a generally triangular waveform.

11. An apparatus for adjusting a first threshold voltage in a relaxation oscillator by using a compensator, the apparatus comprising:
means for charging a first capacitor in the compensator to a first voltage;
means for discontinuing the charging of the first capacitor at an edge of an output signal from a latch;
means for generating a first set of non-overlapping pulses from a switching circuit in the compensator following the edge;
means for discharging the first capacitor through a second capacitor for the duration of a first pulses from the first set of non-overlapping pulses so as to generate a second voltage that is an adjustment of the first threshold voltage by a voltage difference; and
means for applying the second voltage to a comparator circuit as a second threshold voltage.

12. The apparatus of claim 11, wherein the apparatus further comprises means for precharging the first capacitor for the duration of a second pulse from a second set of non-overlapping pulses.

13. The apparatus of claim 11, wherein the edge is a rising edge.

14. The apparatus of claim 11, wherein the edge is a falling edge.

15. The apparatus of claim 11, wherein the apparatus further comprises means for comparing the first threshold voltage with a signal having a generally triangular waveform.

16. An apparatus comprising:
a switching circuit that receives a generally square wave signal and outputs a plurality of non-overlapping pulses;
an integrator that outputs a first threshold voltage;
a first capacitor;
a first switch responsive to the generally square wave signal, wherein the first switch inputs a generally triangular signal into the first capacitor when closed; and
a switch network that is coupled to the first capacitor and that is responsive to the plurality of non-overlapping pulses, wherein the switch network precharges the first capacitor for the duration of at least one of the non-overlapping pulses, and wherein the switch network couples the first capacitor to the integrator for the duration of at least one of the non-overlapping pulses.

17. The apparatus of claim 16, wherein the integrator further comprises:
an amplifier having a plurality of input nodes and an output node; and
a second capacitor forming a feedback loop between the output node and at least one of the input nodes of the amplifier, wherein the second capacitor is coupled to the switching network so that the first capacitor is coupled to the second capacitor to the integrator for the duration of at least one of the non-overlapping pulses.

18. The apparatus of claim 16, wherein the generally triangular signal is output through an output node of a charge pump.

19. The apparatus of claim 16, wherein the apparatus further comprises a comparator circuit that receives the first threshold voltage and the generally triangular signal.

20. The apparatus of claim 19, wherein the apparatus further comprises a latch that is coupled to the comparator circuit and that outputs the generally square wave signal.

* * * * *